United States Patent
Zhou (10) Patent No.: US 11,486,784 B2
(45) Date of Patent: Nov. 1, 2022

(54) PRESSURE TRANSDUCER AND FABRICATION METHOD THEREOF

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventor: Weilong Zhou, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 1029 days.

(21) Appl. No.: 16/099,915

(22) PCT Filed: Jan. 9, 2018

(86) PCT No.: PCT/CN2018/071947
§ 371 (c)(1),
(2) Date: Nov. 8, 2018

(87) PCT Pub. No.: WO2019/024444
PCT Pub. Date: Feb. 7, 2019

(65) Prior Publication Data
US 2021/0223127 A1     Jul. 22, 2021

(30) Foreign Application Priority Data

Jul. 31, 2017  (CN) .......................... 201710642627.0

(51) Int. Cl.
*G01L 11/02* (2006.01)
*H01L 27/28* (2006.01)
(Continued)

(52) U.S. Cl.
CPC ................ *G01L 11/02* (2013.01); *G01L 1/24* (2013.01); *G02F 1/133512* (2013.01);
(Continued)

(58) Field of Classification Search
CPC ...... G01L 11/02; G01L 1/24; G02F 1/133512; G02F 1/13338; H01L 27/288;
(Continued)

(56) References Cited

U.S. PATENT DOCUMENTS

2010/0213360 A1   8/2010   Daiku
2016/0069756 A1   3/2016   Kim et al.
2018/0372565 A1   12/2018  Zhang et al.

FOREIGN PATENT DOCUMENTS

CN          1893751 A   *   1/2007
CN        102721505 A       10/2012
(Continued)

OTHER PUBLICATIONS

CN-1893751-A English Translation, Li (Year: 2007).*
International Search Report and Written Opinion dated May 2, 2018; PCT/CN2018/071947.

Primary Examiner — Ryan D Walsh (57) ABSTRACT

A pressure transducer and a fabrication method thereof are provided. The pressure transducer includes a light-emitting element, an interference light-filtering structure and a light-sensing element stacked on top of each other. The light-emitting element is configured to emit incident light onto the interference light-filtering structure. The interference light-filtering structure is configured to change its thickness in accordance with the pressure exerted on the pressure transducer and generate emergent light corresponding to the pressure. The light-sensing element is configured to detect the emergent light and generate an electrical signal corresponding to the emergent light.

14 Claims, 4 Drawing Sheets

(51) Int. Cl.
*H01L 51/44* (2006.01)
*H01L 51/56* (2006.01)
*G01L 1/24* (2006.01)
*G02F 1/1335* (2006.01)
*G02B 26/00* (2006.01)
*H01L 27/32* (2006.01)
*H01L 31/18* (2006.01)
*G02F 1/1333* (2006.01)

(52) U.S. Cl.
CPC .......... *H01L 27/288* (2013.01); *H01L 51/447* (2013.01); *H01L 51/56* (2013.01); *G02B 26/001* (2013.01); *G02F 1/13338* (2013.01); *H01L 27/3227* (2013.01); *H01L 27/3232* (2013.01); *H01L 31/18* (2013.01)

(58) Field of Classification Search
CPC ... H01L 51/447; H01L 51/56; H01L 27/3227; H01L 27/3232; H01L 31/18; G02B 26/001
See application file for complete search history.

(56) References Cited

FOREIGN PATENT DOCUMENTS

| | | | | |
|---|---|---|---|---|
| CN | 103335758 A | | 10/2013 | |
| CN | 103474583 A | * | 12/2013 | ....... H01L 21/02354 |
| CN | 105606294 A | | 5/2016 | |
| CN | 106124096 A | | 11/2016 | |
| CN | 107421681 A | | 12/2017 | |
| JP | 2015204098 A | * | 11/2015 | ....... G02F 1/133345 |
| WO | WO-2018223906 A1 | * | 12/2018 | ............ H01L 51/50 |

\* cited by examiner

PRESSURE TRANSDUCER AND FABRICATION METHOD THEREOF

CROSS REFERENCE TO RELATED APPLICATIONS

The present application claims the priority benefit of the Chinese patent application No. 201710642627.0, entitled as "A Pressure Transducer and A Fabrication Method Thereof" and filed to SIPO on Jul. 31, 2017, which is incorporated herein by reference in its entirety.

TECHNICAL FIELD

Embodiments of the present disclosure relate to a pressure transducer and a fabrication method thereof.

BACKGROUND

A pressure transducer is a detection device, which can convert, following some rule, a measured pressure into an electrical signal or any other form of information output, as needed, for information transfer, processing, storage, display, recording, control or any other operation. Pressure transducers are sensing devices commonly used in production and living and widely applied in various automatic control environments.

SUMMARY

Embodiments of the present disclosure provide a pressure transducer and a fabrication method thereof.

At least one embodiment of the present disclosure provides a pressure transducer, comprising: a light-emitting element, an interference light-filtering structure and a light-sensing element stacked on top of each other. The light-emitting element is configured to emit incident light onto the interference light-filtering structure; the interference light-filtering structure is configured to change its thickness in accordance with a pressure exerted on the pressure transducer and generate emergent light corresponding to the pressure; and the light-sensing element is configured to detect the emergent light and generate an electrical signal corresponding to the emergent light.

In a possible implementation, in the pressure transducer provided by the embodiment of the present disclosure, the interference light-filtering structure includes a first reflecting layer and a second reflecting layer provided oppositely to each other and an elastic support unit provided between the first reflecting layer and the second reflecting layer.

In a possible implementation, in the pressure transducer provided by the embodiment of the present disclosure, the elastic support unit, the first reflecting layer and the second reflecting layer form a structure with a cavity filled with an inert gas.

In a possible implementation, in the pressure transducer provided by the embodiment of the present disclosure, material of the elastic support unit comprises an elastic transparent material.

In a possible implementation, in the pressure transducer provided by the embodiment of the present disclosure, material of the first reflecting layer comprises silver or aluminum and material of the second reflecting layer comprises silver or aluminum.

In a possible implementation, in the pressure transducer provided by the embodiment of the present disclosure, the light-emitting element comprises a cathode, an anode and an organic functional layer located between the cathode and the anode. The organic functional layer is configured to emit light when an electrical signal is applied to the cathode and the anode.

In a possible implementation, in the pressure transducer provided by the embodiment of the present disclosure, the organic functional layer comprises an electron transport layer, a hole transport layer and an organic light-emitting layer provided between the electron transport layer and the hole transport layer.

In a possible implementation, in the pressure transducer provided by the embodiment of the present disclosure, the light-sensing element is a charge coupled device including a plurality of photodiodes in matrix.

Embodiments of the present disclosure also provides a fabrication method of a pressure transducer, comprising: forming a light-emitting element, an interference light-filtering structure and a light-sensing element staked on top of each other. The light-emitting element is adopted to emit incident light onto the interference light-filtering structure; the interference light-filtering structure is adopted to change its thickness in accordance with a pressure exerted on the pressure transducer and generate emergent light corresponding to the pressure; and the light-sensing element is adopted to detect the emergent light and generate an electrical signal corresponding to the emergent light.

In a possible implementation, in the fabrication method provided by the embodiment of the present disclosure, further comprising: forming the light-emitting element on an upper surface of a first substrate; forming the interference light-filtering structure between a lower surface of the first substrate and an upper surface of a second substrate; and applying an optical adhesive on a lower surface of the second substrate and bonding the lower surface of the second substrate with the light-sensing element.

In a possible implementation, in the fabrication method provided by the embodiment of the present disclosure, further comprising: forming a first reflecting layer of the interference light-filtering structure on the lower surface of the first substrate; forming a second reflecting layer of the interference light-filtering structure on the upper surface of the second substrate; forming an elastic support unit on the lower surface of the first substrate with the first reflecting layer formed thereon; and applying a pressure sensitive adhesive at periphery of the formed elastic support unit and bonding the elastic support unit with the upper surface of the second substrate with the second reflecting layer formed thereon.

In a possible implementation, in the fabrication method provided by the embodiment of the present disclosure, further comprising: forming an, anode, an organic functional layer and a cathode stacked on top of each other on the upper surface of the first substrate, the organic functional layer being disposed between the cathode and the anode, and being adopted to emit light when an electrical signal is applied to the cathode and the anode.

In a possible implementation, the pressure transducer further comprises: a first substrate between the light-emitting element and the interference light-filtering structure; and a second substrate between the interference light-filtering structure and the light-sensing element.

BRIEF DESCRIPTION OF THE DRAWINGS

Embodiments of the present disclosure will be described in more detail below with reference to the accompanying drawings to allow an ordinary skill in the art to more clearly understand embodiments of the present disclosure, in which.

DETAILED DESCRIPTION

Technical solutions of the embodiments will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment(s), without any creative work, which shall be within the scope of the disclosure.

Unless otherwise defined, all the technical and scientific terms used herein have the same meanings as commonly understood by one of ordinary skill in the art to which the present disclosure belongs. The terms, such as 'first,' 'second,' or the like, which are used in the description and the claims of the present disclosure, are not intended to indicate any sequence, amount or importance, but for distinguishing various components. The terms, such as 'comprise/comprising,' include/including; or the like are intended to specify that the elements or the objects stated before these terms encompass the elements or the objects and equivalents thereof listed after these terms, but not preclude other elements or objects. The terms, 'on,' 'under,' 'left,' 'right,' or the like are only used to indicate relative position relationship, and when the absolute position of the object which is described is changed, the relative position relationship may be changed accordingly.

It has been noticed by the present inventor that a pressure transducer mainly composed of mechanical structures and indicating pressure by deformation of an elastic element has a large size and a high weight and cannot provide any electrical output. With development of technologies of new materials, new transducers emerge correspondingly. A piezoelectric pressure transducer is a transducer that converts a measured pressure into an electrical signal utilizing the piezoelectric effect of piezoelectric materials. A piezoelectric pressure transducer has advantages of a small volume, a simple construction and being capable of providing an electrical output and is a most widely used pressure transducer. However, a piezoelectric pressure transducer still has disadvantages of a relatively low resolution, insensitivity to tiny strain and poor measurement response to a tiny magnitude of force.

Figure 1A:
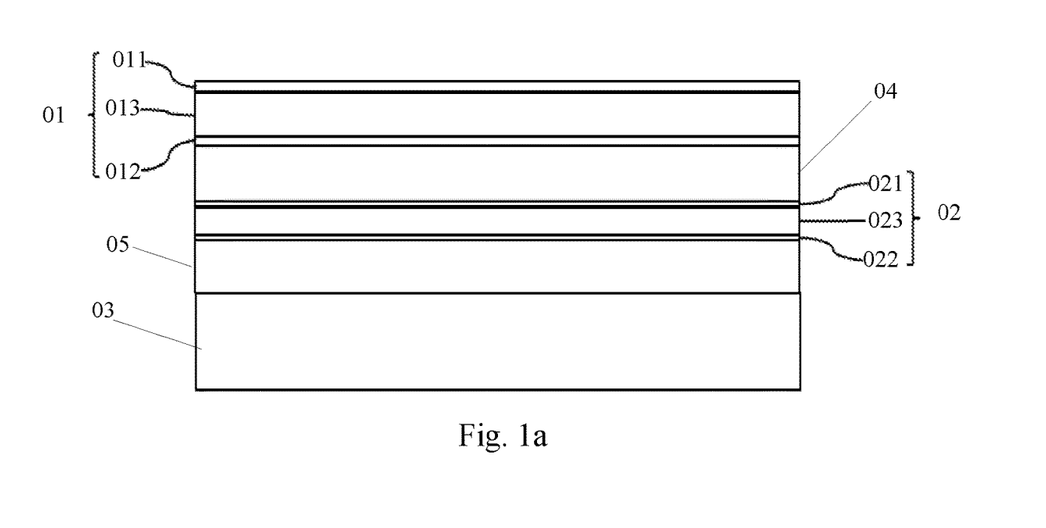
FIGS. 1a and 1b are respectively structure diagrams of a pressure transducer provided in an embodiment of the present disclosure.
Figure 1B:
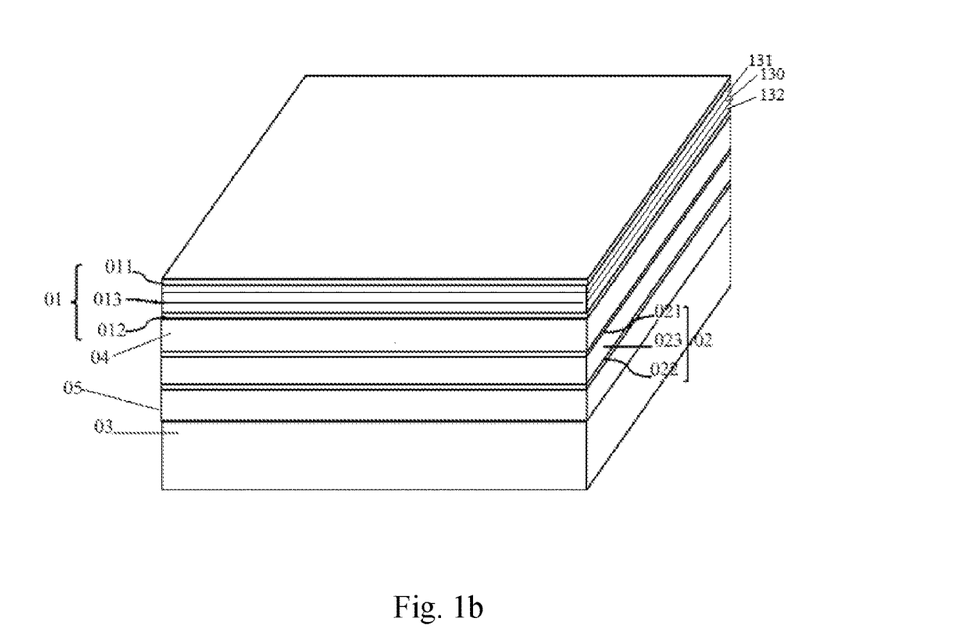

An embodiment of the present disclosure provides a pressure transducer, which, as shown in FIGS. 1a and 1b, may include a light-emitting element 01, an interference light-filtering structure 02 and a light-sensing element 03 stacked on top of each other. The light-emitting element 01 is adopted to emit incident light to the interference light-filtering structure 02. The interference light-filtering structure 02 is adopted to change its thickness in accordance with a pressure exerted on the pressure transducer and generate emergent light corresponding to the pressure. The light-sensing element 03 is adopted to detect the emergent light and generate an electrical signal corresponding to the emergent light.

In the above-mentioned pressure transducer provided in the embodiment of the present disclosure, as shown in FIG. 1a, in addition to the light-emitting element, the interference light-filtering structure and the light-sensing element stacked on top of each other, the pressure transducer may also include a first substrate 04 positioned between the light-emitting element and the interference light-filtering structure 02 and a second substrate 05 positioned between the interference light-filtering structure 02 and the light-sensing element 03. The first and second substrates may be glass substrates. For example, the light emitted from the light-emitting element is incident on the interference light-filtering structure, which changes its thickness in accordance with an external pressure exerted on the pressure transducer and generates emergent light corresponding to the external pressure through multiple-beam interference with the incident light, so that the emergent light is detected by the light-sensing element to realize pressure detection. In this way, the pressure exerted on the pressure transducer can be detected by the light-sensing element detecting the emergent light. The pressure sensor/transducer assembly measures a corresponding pressure through light sensing, it has high resolution and sensitivity and is capable of detecting surface pressure.

Figure 1C:
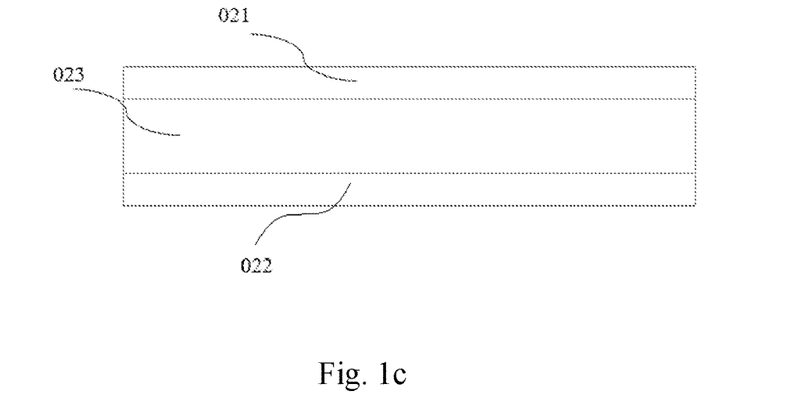
FIGS. 1c and 1d are schematically structural diagrams of cavity structures provided in two embodiments of the present disclosure, respectively.
Figure 1D:
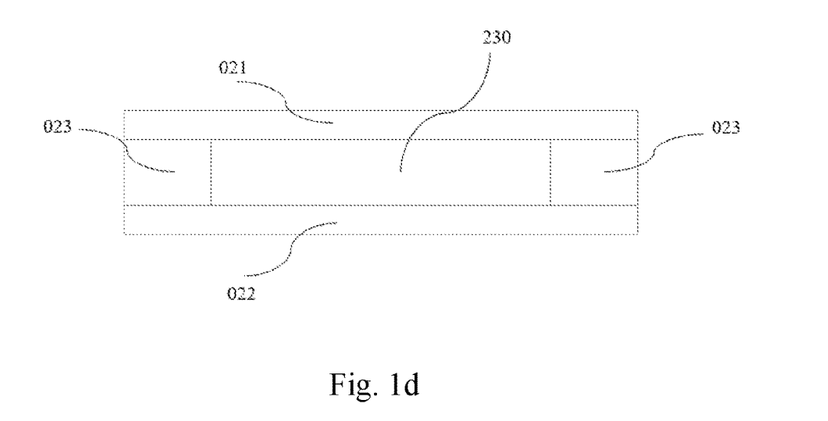

For example, in the above-mentioned pressure transducer provided the embodiment of the present disclosure, as shown in FIGS. 1a and 1c, the interference light-filtering structure may include a first reflecting layer 021 and a second reflecting layer 022 disposed oppositely to each other as well as an elastic support unit 023 located between the first reflecting layer 021 and the second reflecting layer 022. For example, the first and second reflecting layers are adopted to reflect the incident light and the elastic support unit is adopted to deform in accordance with an external pressure. A shown in FIG. 1d, the elastic support unit 023, the first reflecting layer 021, and the second reflecting layer 022 may form a struture with a hollow cavity 230. The hollow cavity 230 may be filled with an inert gas, such as nitrogen gas. The interference light-filtering structure may filter out an approximately monochromatic light of a very narrow waveband out of white light under a principle of multiple-beam interference. As a typical type of interference light-filtering structure, an interference filter with metal reflecting films may effectively change the spectrum shape and thus the color of the emergent light by changing two metal mirrors (e.g. the reflectivities of the first and second reflecting layers) and the cavity length between the two metal mirrors (e.g. the distance between the first and second reflecting layers). For example, the materials of the first and second reflecting layers may be silver or aluminum and the distance between the first and second reflecting layers is defined as the length L of the interference light-filtering cavity. For example, the length L of the interference light-filtering cavity may be adjusted by regulating the gas pressure in the interference light-filtering cavity with a regulating device or by applying an external force perpendicularly to the first and second reflecting layers; however, embodiments of the present disclosure are not limited thereto.

For example, in the above-mentioned pressure transducer provided in the embodiment of the present disclosure, the material of the elastic support unit may be a transparent elastic material. For example, a transparent material of relatively high performance parameters (e.g. young's modulus of elasticity) is adopted to fabricate the elastic support unit, which may effectively generate elastic deformation under an external pressure.

Figure 2:
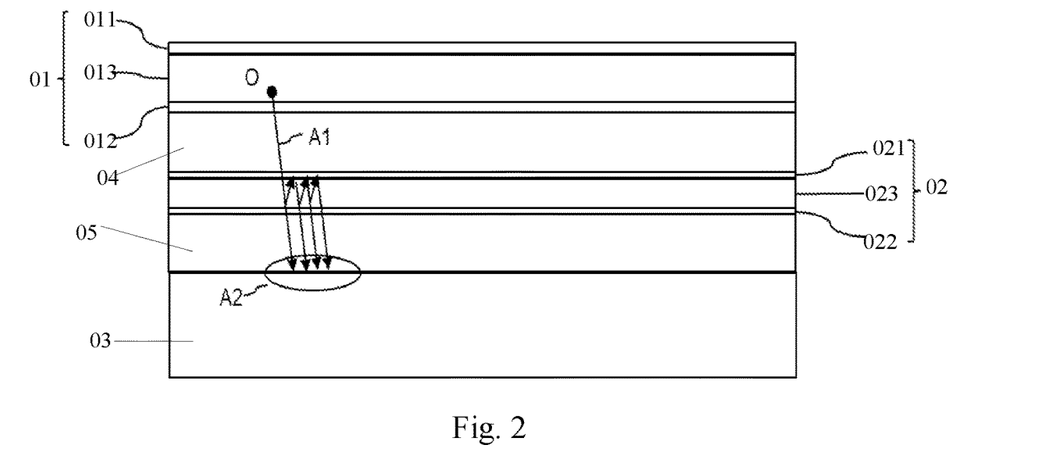
FIG. 2 is a schematic diagram illustrating the principle of pressure measuring of a pressure transducer provided in an embodiment of the present disclosure.

For example, as shown in FIG. 2, the light-emitting element 01 emits light A1 at point 0, which is incident on the interference light-filtering structure 02, output as emergent light A2 after subjecting multiple-beam interference in the interference light-filtering structure and then detected by the light-sensing element 03. The color of the light A2 is controlled by the length L of the interference light-filtering cavity, so that a correspondence relationship between the length L and the detection signal of the light-sensing element can be established. Moreover, the length L of the interference light-filtering cavity is dependent on the pressure applied perpendicularly to the first and second reflecting layers.

In accordance with the principle of Fabry-Perot interference, the effect on the maximum transmitted central wavelength $\lambda_c$ and the full width at half maximum (FWHM) of the transmission curve are given by:

$$\lambda_c = 2nL/m$$

$$FWHM = \frac{\lambda_c^2}{2\pi nL} \cdot \frac{1-R}{R}$$

where m=1, 2, 3 . . . , n is the refractive index of the gas filled in the interference light-filtering structure and R is the reflectivity of the first and second reflecting layers. As shown in the equations above, the maximum transmitted central wavelength $\lambda_c$ may be changed effectively by regulating the length L of the interference light-filtering cavity; the full width at half maximum (FWHM) of the transmission curve is not only dependent on the length L of the interference light-filtering cavity, but also on the reflectivity R of the first and second reflecting layers, which follows a law that the higher the reflectivity R is, the narrower the FWHM of the transmission curve is. In this way, the above-mentioned control of light color can be realized by regulating the spacing between the first reflecting layer and the second reflecting layer of the interference light-filtering structure.

Figure 3:
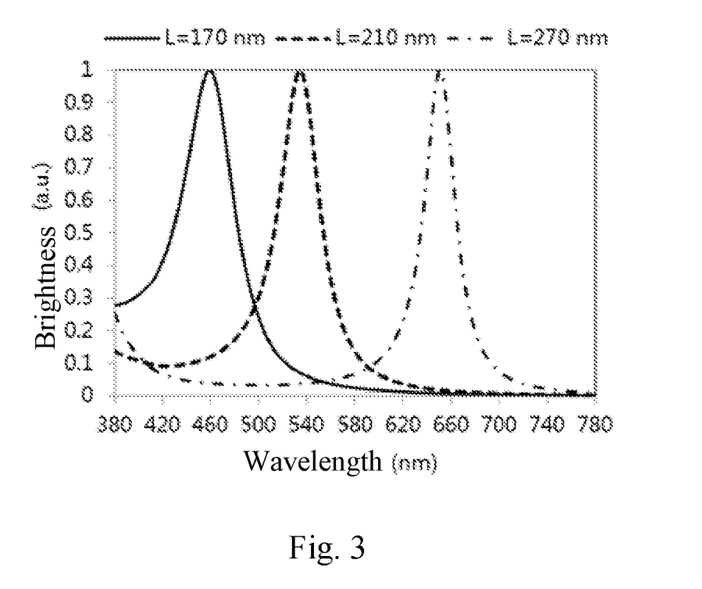
FIG. 3 is a schematic diagram showing transmission graphs of an interference light-filtering structure at different lengths L of the interference light-filtering cavity in an embodiment of the present disclosure.
Figure 4:
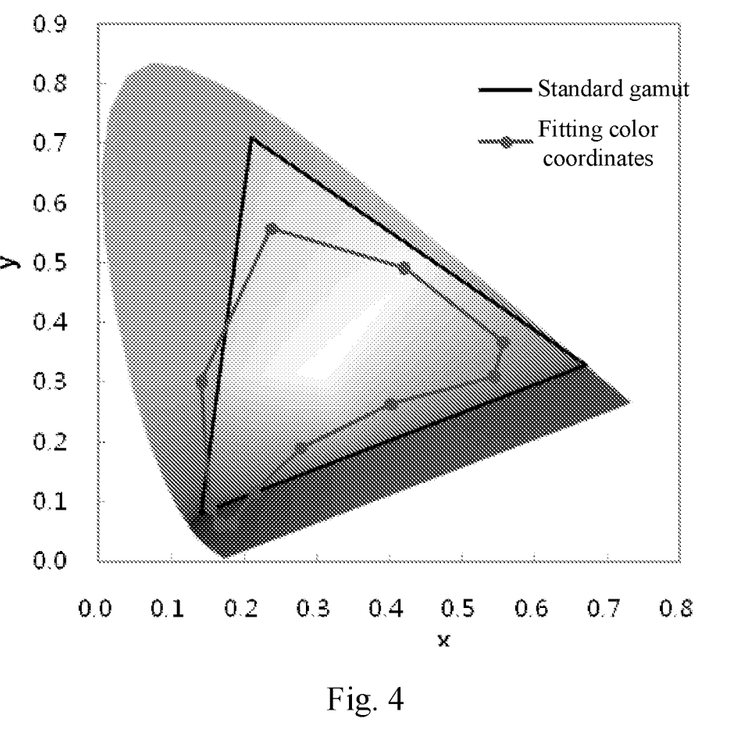
FIG. 4 is schematic diagram of graphs illustrating how chromaticity coordinates change with the length L of the interference light-filtering cavity in an embodiment of the present disclosure.

FIG. 3 shows transmission graphs of the interference light-filtering structure obtained by software fitting at different lengths L of the interference light-filtering cavity. The structure of the pressure transducer on which the fitting is to be performed includes an organic light-emitting element, a first glass substrate, an interference light-filtering structure, a second glass substrate and a light-sensing element stacked on top of each other. The organic light-emitting element includes a cathode (100 nm), an auxiliary cathode (1.5 nm), a composite light-emitting layer (30 nm), a hole transport layer (40 nm) and an anode (100 nm). The interference light-filtering structure includes a first reflecting layer (30 nm), an inert gas (L) and a second reflecting layer (30 nm). FIG. 4 shows how chromaticity coordinates (CIE) change with the length L of the interference light-filtering cavity. As shown in FIGS. 3 and 4, the transmission spectrum can actually be regulated by changing the length L of the interference light-filtering cavity. Specific data are given in the following table 1.

TABLE 1

| L(nm) | 170 | 180 | 190 | 200 | 210 | 220 | 230 | 240 | 250 | 260 |
|---|---|---|---|---|---|---|---|---|---|---|
| CIE_x | 0.144 | 0.125 | 0.122 | 0.162 | 0.242 | 0.338 | 0.435 | 0.518 | 0.571 | 0.582 |
| CIE_y | 0.337 | 0.419 | 0.574 | 0.688 | 0.691 | 0.629 | 0.544 | 0.465 | 0.411 | 0.393 |

For example, in the above-mentioned pressure transducer provided in the embodiment of the present disclosure, as shown in FIG. 1a, the light-emitting element may include a cathode 011, an anode 012 and an organic functional layer 013 between the cathode 011 and the anode 012. The organic functional layer 013 is adopted to emit light when an electrical signal is applied to the cathode 011 and the anode 012. For example, the light-emitting element may be an oarganic light-emitting diode (OLED) device including a cathode, an anode and an organic functional layer. An OLED device has its organic material emit light under application of an electric field and has advantages, such as a high contrast, capability of being ultrathin and flexible, short response time and the like. The organic functional layer 013 may include an electron transport layer 131, a hole transport layer 132, and an organic light-emitting layer 130 located between the electron transport layer 131 and the hole transport layer 132. The anode of the OLED device may include a transparent metal, e.g. ITO, and the cathode may include a total reflection material, such as silver or aluminum.

For example, in the above-mentioned pressure transducer provided in the embodiment of the present disclosure, the light-sensing element may be a charge coupled device including a plurality of photodiodes in matrix. Light rays may be sensed and converted into an electrical signal by the charged coupled element and then converted into a corresponding digital signal through an external circuit for sampling, magnifying and analog-to-digital conversion.

Based on the same inventive concept, an embodiment of the present disclosure also provides a fabrication method of a pressure transducer, which includes fabricating a light-emitting element, an interference light-filtering structure and a light-sensing element stacked on top of each other. The light-emitting element is adopted to emit incident light onto the interference light-filtering structure. The interference light-filtering structure is adopted to change its thickness in accordance with the pressure exerted on the pressure transducer and generate emergent light corresponding to the pressure. The light-sensing element is adopted to detect the emergent light and generate an electrical signal corresponding to the emergent light.

For example, using the above-mentioned fabrication method provided in the embodiment of the present disclosure, a light-emitting element, an interference light-filtering structure and a light-sensing element stacked on top of each other may be formed, so that the light emitted from the light-emitting element is incident on the interference light-filtering structure, which changes its thickness in accordance with an external pressure exerted on the pressure transducer and generates emergent light corresponding to the external pressure through multiple-beam interference with the incident light; the emergent light is detected by the light-sensing element for pressure detection. The color of the emergent light can be controlled by the length L of the interference light-filtering structure dependent on the pressure applied perpendicularly thereto, so that a correspondence relationship between the length L of the interference light-filtering structure and the detection signal of the light-sensing element is established. In this way, the pressure exerted on the pressure transducer can be detected by the light-sensing element detecting the emergent light. Moreover, the pressure sensor/transducer assembly can measure a corresponding pressure through the light sensing, it has high resolution and sensitivity and is capable of detecting surface pressure.

Figure 5:
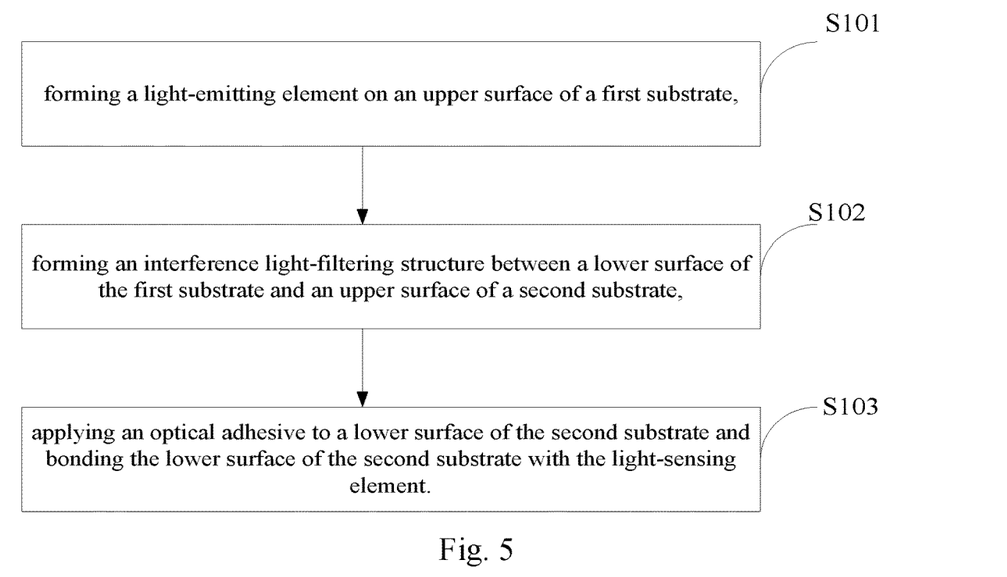
FIG. 5 is a flow chart illustrating a fabrication method of a pressure transducer provided in an embodiment of the present disclosure.

For example, in the above-mentioned fabrication method provided in the embodiment of the present disclosure, as shown in FIG. 5, forming a light-emitting element, an interference light-filtering structure and a light-sensing element stacked on top of each other may include following operations.

S101, forming a light-emitting element on an upper surface of a first substrate.

S102, forming an interference light-filtering structure between a lower surface of the first substrate and an upper surface of a second substrate.

S103, applying an optical adhesive to a lower surface of the second substrate and bonding the lower surface of the second substrate with the light-sensing element.

Figure 6:
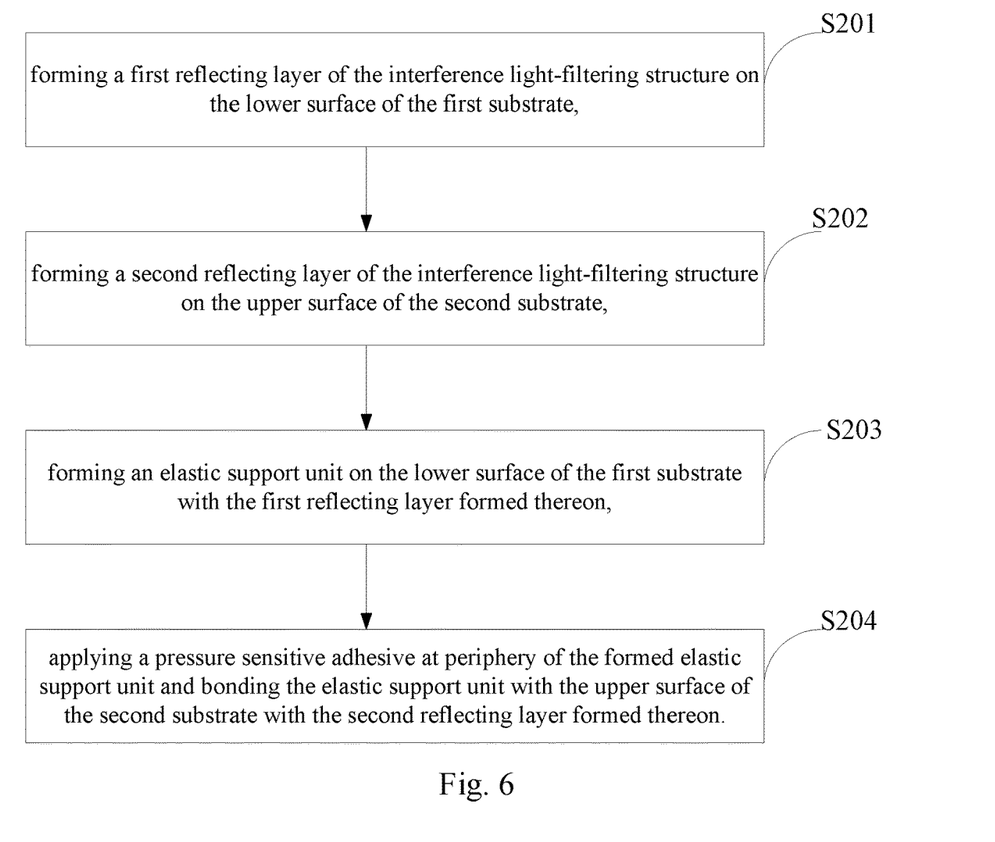
FIG. 6 is a flow chart illustrating a specific process of fabricating an interference light-filtering structure provided in an embodiment of the present disclosure.

For example, in the above-mentioned fabrication method provided in the embodiment of the present disclosure, as shown in FIG. 6, step S102 may include following operations.

S201, forming a first reflecting layer of the interference light-filtering structure on the lower surface of the first substrate.

S202, forming a second reflecting layer of the interference light-filtering structure on the upper surface of the second substrate.

S203, forming an elastic support unit on the lower surface of the first substrate with the first reflecting layer formed thereon.

S204, applying a pressure sensitive adhesive at periphery of the formed elastic support unit and bonding the elastic support unit with the upper surface of the second substrate with the second reflecting layer formed thereon.

For example, in the above-mentioned fabrication method provided in the embodiment of the present disclosure, step S101 may include forming an anode, an organic functional layer and a cathode stacked on top of each other on the upper surface of the first substrate. The organic functional layer is located between the cathode and the anode and adopted to emit light when an electrical signal is applied to the cathode and the anode.

Embodiments of the present disclosure provide a pressure transducer and a fabrication method thereof, the pressure transducer includes a light-emitting element, an interference light-filtering structure and a light-sensing element stacked on top of each other. The light-emitting element is adopted to emit incident light onto the interference light-filtering structure. The interference light-filtering structure is adopted to change its thickness in accordance with the pressure exerted on the pressure transducer and generate emergent light corresponding to the pressure. The light-sensing element is adopted to detect the emergent light and generate an electrical signal corresponding to the emergent light. In this way, the light emitted from the light-emitting element is incident on the interference light-filtering structure, which changes its thickness in accordance with the external pressure exerted on the pressure transducer and generates emergent light corresponding to the external pressure through multiple-beam interference with the incident light; and the emergent light is detected by the light-sensing element for pressure detection. The color of the emergent light may be controlled by the length L of the interference light-filtering structure dependent on the pressure applied perpendicularly thereto, so that a correspondence relationship between the length L of the interference light-filtering structure and the detection signal of the light-sensing element is established. In this way, the pressure exerted on the pressure transducer can be detected by the light-sensing element detecting the emergent light. Moreover, the pressure sensor/transducer assembly can measure a corresponding pressure through the light sensing, it has high resolution and sensitivity and is capable of detecting a surface pressure.

The described above are only exemplary embodiments of the present disclosure, and the present disclosure is not intended to be limited thereto. For one of ordinary skill in the art, various changes and alternations may be readily contemplated without departing from the technical scope of the present disclosure, and all of these changes and alternations shall fall within the scope of the present disclosure.

What is claimed is:

1. A pressure transducer, comprising: a light-emitting element, an interference light-filtering structure and a light-sensing element stacked on top of each other, wherein
    the light-emitting element is configured to emit incident light onto the interference light-filtering structure;
    the interference light-filtering structure is configured to change its thickness in accordance with a pressure exerted on the pressure transducer and generate emergent light corresponding to the pressure;
    the light-sensing element is configured to detect the emergent light and generate an electrical signal corresponding to the emergent light; and
    the interference light-filtering structure includes a first reflecting layer and a second reflecting layer provided oppositely to each other and an elastic support unit provided between the first reflecting layer and the second reflecting layer;
    wherein the elastic support unit, the first reflecting layer, and the second reflecting layer form a structure with a cavity filled with an inert gas.

2. The pressure transducer according to claim 1, wherein material of the elastic support unit comprises an elastic transparent material.

3. The pressure transducer according to claim 1, wherein material of the first reflecting layer comprises silver or aluminum and material of the second reflecting layer comprises silver or aluminum.

4. The pressure transducer according to claim 1, wherein the light-emitting element comprises a cathode, an anode and an organic functional layer located between the cathode and the anode, wherein the organic functional layer is configured to emit light when an electrical signal is applied to the cathode and the anode.

5. The pressure transducer according to claim 4, wherein the organic functional layer comprises an electron transport layer, a hole transport layer and an organic light-emitting layer provided between the electron transport layer and the hole transport layer.

6. The pressure transducer according to claim 1, wherein the light-sensing element is a charge coupled device including a plurality of photodiodes in matrix.

7. The pressure transducer according to claim 1, further comprising: a first substrate between the light-emitting element and the interference light-filtering structure; and a second substrate between the interference light-filtering structure and the light-sensing element.

8. A fabrication method of a pressure transducer, comprising:
   forming a light-emitting element, an interference light-filtering structure and a light-sensing element stacked on top of each other;
   wherein the light-emitting element is adopted, to emit incident light onto the interference light-filtering structure;
   the interference light-filtering structure is adopted to change its thickness in accordance with a pressure exerted on the pressure transducer and generate emergent light corresponding to the pressure; and
   the light-sensing element is adopted to detect the emergent light and generate an electrical signal corresponding to the emergent light;
   forming the light-emitting element on an upper surface of a first substrate;
   forming the interference light-filtering structure between a lower surface of the first substrate and an upper surface of a second substrate; and
   applying an optical adhesive on a lower surface of the second substrate and bonding the lower surface of the second substrate with the light-sensing element.

9. The fabrication method according to claim 8, further comprising:
   forming a first reflecting layer of the interference light-filtering structure on the lower surface of the first substrate;
   forming a second reflecting layer of the interference light-filtering structure on the upper surface of the second substrate;
   forming an elastic support unit on the lower surface of the first substrate with the first reflecting layer formed thereon; and
   applying a pressure sensitive adhesive at periphery of the formed elastic support unit and bonding the elastic support unit with the upper surface of the second substrate with the second reflecting layer formed thereon.

10. The fabrication method according to claim 8, further comprising:
    forming an anode, an organic functional layer and a cathode stacked on top of each other on the upper surface of the first substrate;
    wherein the organic functional layer is disposed between the cathode and the anode, and is adopted to emit light when an electrical signal is applied to the cathode and the anode.

11. The fabrication method according to claim 10, wherein the organic functional layer comprises an electron transport layer, a hole transport layer and an organic light-emitting layer provided between the electron transport layer and the hole transport layer.

12. The fabrication method according to claim 11, wherein the light-sensing element is a charge coupled device including a plurality of photodiodes in matrix.

13. The fabrication method according to claim 8, wherein the elastic support unit is made of an elastic transparent material.

14. The fabrication method according to claim 13, wherein the first reflecting layer is made of silver or aluminum and the second reflecting layer is made of silver or aluminum.

* * * * *